US007286951B2

(12) United States Patent
Sutton

(10) Patent No.: US 7,286,951 B2
(45) Date of Patent: Oct. 23, 2007

(54) EXTERNALLY CONTROLLABLE ELECTRONIC TEST PROGRAM

(75) Inventor: Christopher K Sutton, Everett, WA (US)

(73) Assignee: Agilent Technologies, Inc., Palo Alto, CA (US)

( * ) Notice: Subject to any disclaimer, the term of this patent is extended or adjusted under 35 U.S.C. 154(b) by 536 days.

(21) Appl. No.: 10/141,717

(22) Filed: May 9, 2002

(65) Prior Publication Data

US 2003/0212522 A1 Nov. 13, 2003

(51) Int. Cl.
*G01R 31/00* (2006.01)
*G01R 31/14* (2006.01)

(52) U.S. Cl. ..................................... 702/117

(58) Field of Classification Search ........ 702/117–119, 702/123
See application file for complete search history.

(56) References Cited

U.S. PATENT DOCUMENTS

| 6,002,992 | A | * | 12/1999 | Pauwels et al. ............. 702/123 |
| 6,128,759 | A | * | 10/2000 | Hansen ....................... 714/738 |
| 6,449,744 | B1 | * | 9/2002 | Hansen ....................... 714/738 |
| 6,968,302 | B1 | * | 11/2005 | Ahrens et al. ................ 703/13 |
| 7,050,921 | B2 | * | 5/2006 | Sutton ........................ 702/120 |
| 2003/0093728 | A1 | * | 5/2003 | Sutton ........................ 714/718 |
| 2003/0097233 | A1 | * | 5/2003 | Sutton et al. ............... 702/123 |

FOREIGN PATENT DOCUMENTS

| EP | 1 314 989 | 5/2003 |
| EP | 1 361 447 | * 11/2003 |
| JP | 2003-330750 | * 11/2003 |
| WO | WO 99 47937 | 9/1999 |

OTHER PUBLICATIONS

National Instruments, "TestStand—A Complete Test Executive Environment," National Instruments, p. 55-60 (Mar. 2000).
"LabviewUser Manual" [online], Nov. 2001, National Instrument XP002260913, Retrieved on Oct. 28, 2003, Retrieved from the Internet: <URL: http://www.ni.com/pdf/manuals/32099d.pdf>, Nov. 2001.
Butler, H. "Virtual Remote: The Centralized Expert", 1266 Hewlett-Packard Journal, Hewlett-Packard Co., Palo Alto, US, vol. 45, No. 5, Oct. 1, 1994, pp. 75-82, XP000471161.
Fertitta K.G. et al: "The Role of Activex and Com in Ate", Autotestcon 1999, IEEE Systems Readiness Technology Conference, 1999, IEEE San Antonio, TX, USA, Aug. 30, 1999-Sep. 2, 1999, Piscataway, NJ, USA, IEEE, US, Aug. 30, 1999, pp. 35-51, XP010356128.
"Getting Started with Labview"; Jul. 2000; National Instruments Corporation; pp. 1-1, 1-2, 3-1 through 3-7, 5-2, A-1 and A-2.

* cited by examiner

*Primary Examiner*—Michael Nghiem
(74) *Attorney, Agent, or Firm*—Marc Bobys

(57) ABSTRACT

Disclosed is a product that provides a test executive program for controlling tests on a device under test that is separate and distinct from the test executive system. The product may be embodied in a media storing instructions that direct a processing unit to 1) perform an electronic test on the device under test, 2) provide an interface for communicating with an external system that is distinct from the test executive program, and for permitting the test system to be operated by the external system, 3) communicate with the external system, and 4) in response to signals generated by the external system, operate the test system. Other test executive methods and apparatus are also disclosed.

18 Claims, 7 Drawing Sheets

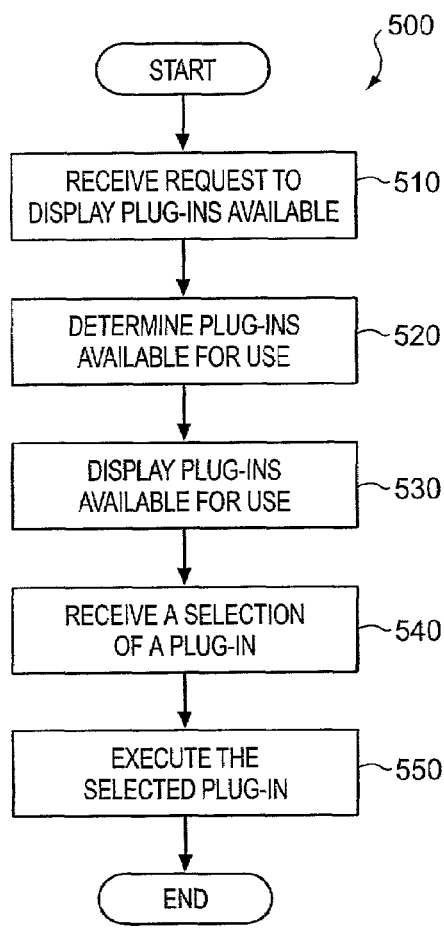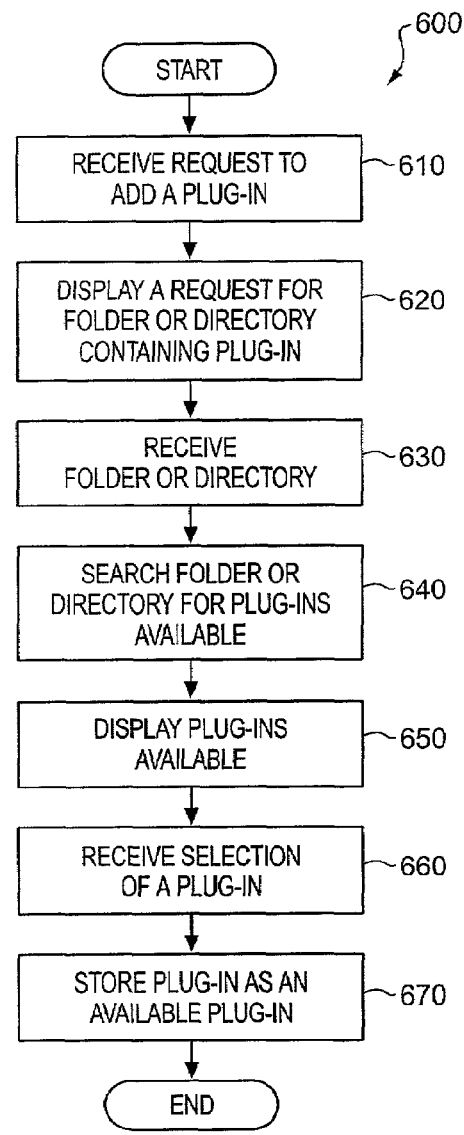

EXTERNALLY CONTROLLABLE ELECTRONIC TEST PROGRAM

BACKGROUND OF THE INVENTION

Complex electronic, electro-mechanical, and mechanical devices are generally tested using automated test systems. The tests may include validation tests which run through the various operations of a device under test (DUT) and records whether each operation was performed properly. The tests may also include environmental tests which expose the DUT to various combinations of temperature, pressure, and humidity. The results of operations are recorded as the environment changes. Other tests, such as production tests, may be completed. Generally, both the DUT and the systems providing the environmental and other constraints on the DUT are controlled electronically. In the last decade or so, computerized programs which are capable of controlling a variety of automated tests, referred to in the art as "test executive" programs, have been developed.

Test executive programs in the prior art include internal test executive programs developed by Agilent Technologies and TESTSTAND software developed by National Instruments Corporation, which is described as a ready-to-run test executive program for organizing, controlling and executing automated prototype, validation, or production test systems. The prior art Agilent Technologies test systems were DOS-based systems that do not use a graphical user interface (GUI), which limited the ability of the program to interact with other programs. The TESTSTAND software, while using a GUI, also is essentially a stand-alone program that does not interact with other separate systems.

Tests usually are defined by a set of rules or specifications to which the DUT is compared. The rules and specifications generally comprise various inputs defined by electrical and mechanical parameters applied to the DUT, such as voltage, current, specified manipulations of controls and device parts, as well as environmental parameters under which the test is conducted, such as temperature, humidity, pressure, and the time period over which a parameter is applied. Each test will include many combinations of the parameters applied to each element of the DUT, and often will be repeated many times. Each combination of parameters will define a measurement that results in one or more datapoints, which are recorded and compared to numerical or Boolean limits defining the specifications. Thus, as devices become more complex, electronic test programs have become very long and complex, often requiring several days, or even a week or more to complete a test.

The DUTs are often tested by or used in conjunction with other electronic instruments. For example, manufacturing process controllers and environmental test profile controllers are often used to perform tests on a DUT. These electronic instruments perform other functions as well as testing and thus are not fully replaceable by a test executive system. In prior art test executive systems, it was necessary to reconfigure the interface between such systems and the DUT each time it was desired to test the DUT. After the test, the original configuration had to be restored. Tests could be performed much quicker and more effectively if such reconfigurations were eliminated. Moreover, it would be useful if those used to operating such other systems did not have to adjust to or learn an entirely new system when it was necessary to test the DUT.

SUMMARY OF THE INVENTION

The above and other problems are solved and an advance in the art is made by an externally controllable electronic test program in accordance with this invention. The electronic test program of this invention provides an interface that communicates with an external system, such as separate software programs. The interface allows the external system to control the executive test program through the interface.

The present invention comprises both a computer apparatus and software product and methods executed by a processing unit. One skilled in the art will recognize that the instructions for the processes or methods of this invention may be stored in a memory as software instructions, may be fixed hardware, or stored as firmware.

The invention provides an electronic test system for testing a device under test (DUT) that is separate and distinct from the electronic test system, the test system comprising: a memory for storing an electronic test and an interface for communicating with an external system distinct from the test system and separate and distinct from the DUT and operating said test system with the external system; a display for displaying a graphical user interface (GUI) for operating the electronic test system and the results of the test; an electronic processor communicating with the memory for executing the test and with the display for displaying the results; and an input device for operating the GUI. Preferably, the interface comprises a software object. Preferably, the interface comprises an ActiveX COM interface. Preferably, the external system is a computer remote from the memory and processor. Alternatively, the external system is a software program stored in the memory, such as a software database system. Preferably, the GUI includes a drop-down menu for selecting one of a plurality of the interfaces. Preferably, the GUI comprises a GUI associated with the external system.

The invention also provides a product that provides a test executive program for controlling tests on a device under test (DUT) separate and distinct from the test executive system, the product comprising: instructions for directing a processing unit to: perform an electronic test on the DUT; provide interface software for communicating with an external system that is distinct from the test executive program; communicate with the external system and operate said test system responsive to the communication; and a media readable by the processing unit that stores the instructions. Preferably, the instructions further comprise: instructions for directing the processing unit to: display a list of different software interfaces for communicating with an external system that is distinct from the test executive program; receive a selection of one of the different software interfaces on the list; and load the selected interface into a memory. Preferably, the instructions further comprise instructions for directing the processing unit to execute the selected one of the plurality of interfaces. Preferably, the instructions further comprise instructions for directing the processing unit to remove the selected interface from the memory. Preferably, the instructions comprise an ActiveX COM interface.

The invention further provides a method of operating an electronic test system for testing a device under test (DUT) that is separate and distinct from the electronic test system, the method comprising: storing an electronic test and a software interface for communicating with an external system distinct from the test system and separate and distinct from the DUT and for operating said test system in response to said communication; displaying a graphical user interface (GUI) for operating the electronic test system; executing the test to produce test results; storing the test results; executing the software interface; receiving a communication from the external system; and, responsive to the communication, operating the test system. Preferably, the external system comprises an external software program and the act of receiving comprises executing the software program. Preferably, the act of displaying comprises displaying a GUI associated with the external software program. Preferably, the act of executing comprises executing a software object. Preferably, the act of storing comprises: displaying a list of a plurality of different software interfaces; receiving a selection of one of the plurality of software interfaces; and loading the selected software interface into a memory.

BRIEF DESCRIPTION OF THE DRAWINGS

The above and other features of this invention are described in the Detailed Description below and the following drawings:

FIG. 5 illustrates a flow diagram for an application that provides plug-in selection in accordance with the preferred embodiment of this invention;

FIG. 6 illustrates a flow diagram for an application for adding a plug-in to the plug-ins available in accordance with a preferred embodiment of this invention;

DETAILED DESCRIPTION OF THE PREFERRED EMBODIMENT

Figure 1:
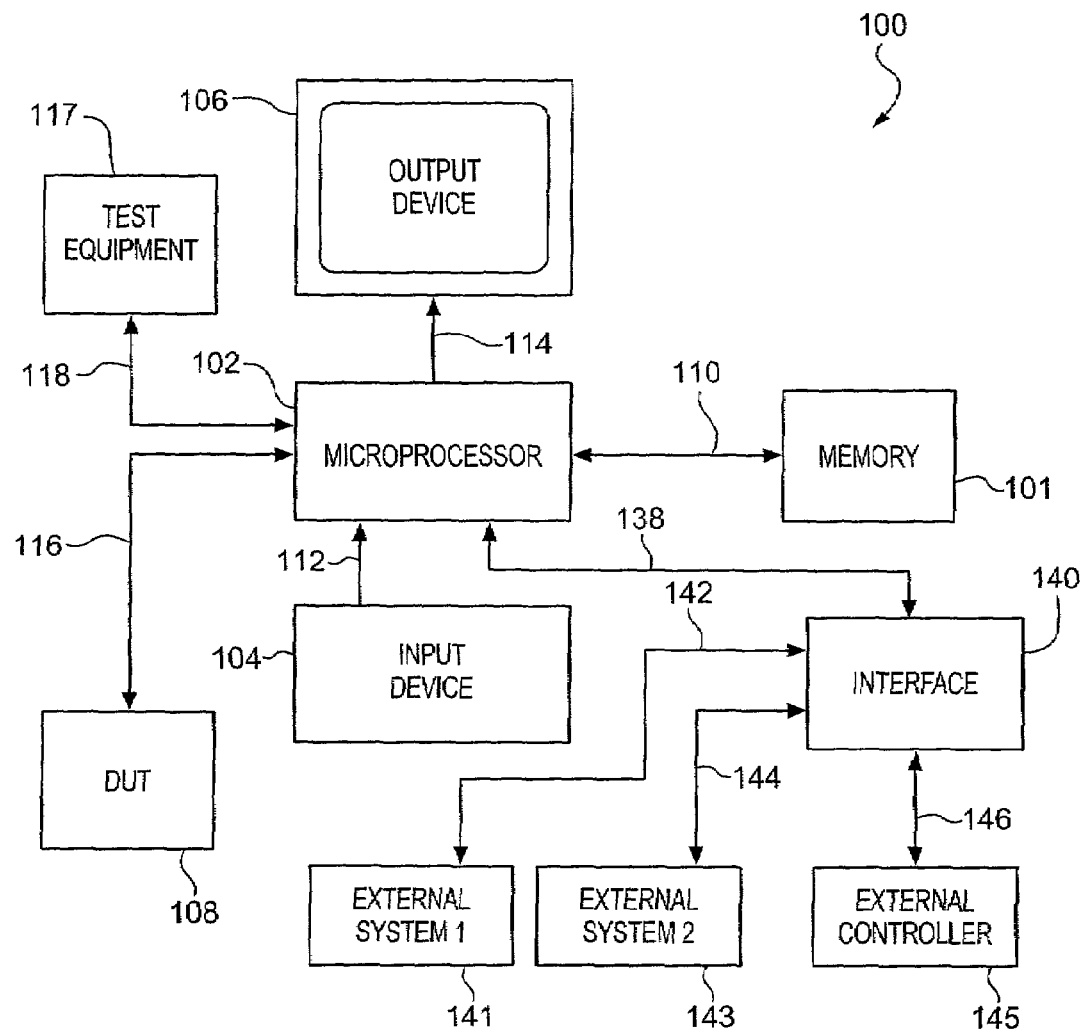
FIG. 1 illustrates a block diagram of hardware components that execute an electronic test program in accordance with this invention.

The present invention relates to an electronic test executive program. FIG. 1 illustrates an electronic test system 100 that executes a test executive program in accordance with this invention. In the preferred embodiment, the test system comprises a computer system 100 that includes memory 101, microprocessor 102, input device 104, output device 106, and software including interface 140. Memory 101 connects to microprocessor 102 via path 110. Memory 101 may comprise a hard drive, a tape drive, a non-volatile memory such as a Read Only Memory (ROM) or a volatile memory such as a Random Access Memory (RAM) or other conventional memories or combinations of the above. Input device 104 connects to microprocessor 102 via path 112. Input device 104 may be a keyboard, mouse, joystick, or any other device and software driver that allows a user to input data. Interface 140 is a key element of the invention, and will be described in more detail below. Interface 140 communicates with microprocessor 102 via path 138 and with systems 141, 142 and 145 that are external to electronic test system 100. Interface 140 preferably comprises software resident in a RAM portion of memory 101 when it is active.

Figure 8:
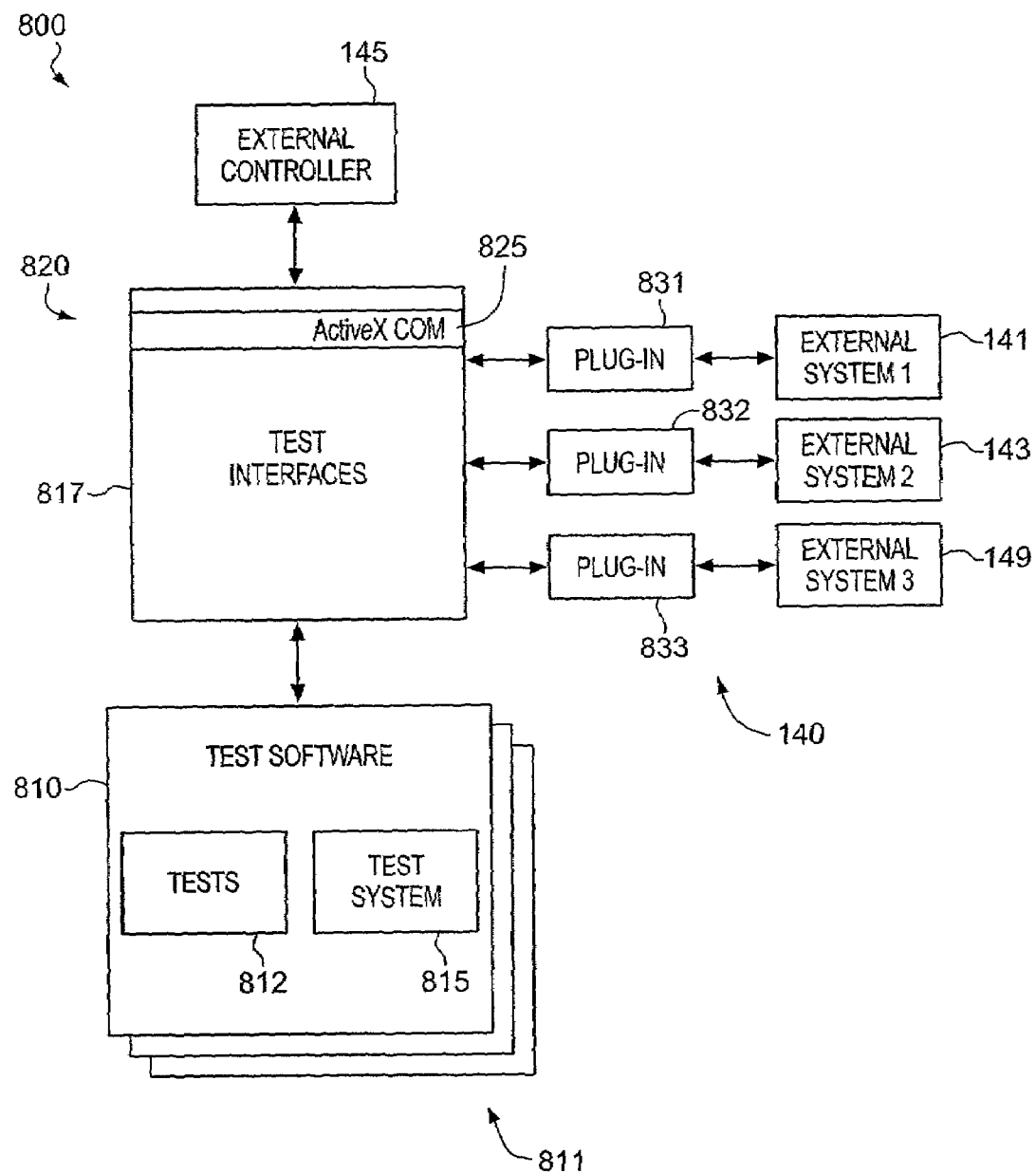
FIG. 8 illustrates a block diagram of software components of a test executive program in accordance with this invention.

Here, "external" means outside the test executive system 800 (FIG. 8). It does not necessarily mean in a separate computer, but may be a distinct software system residing in computer 100, which software is separate and distinct from the software of test executive system 800. External systems 141 and 143 may be hardware systems, software systems, or combinations thereof. Typically, external systems 141 and 143 are software programs, such as Microsoft Excel™. External Controller 145 may be a remote computer system, a manufacturing process controller, or other such system. Interface 140 communicates with external system 141 via path 142, external system 143 via path 144, and external controller 145 via path 146.

In this disclosure, "separate" means located in a separate physical housing, and "distinct" means independently operable.

In a preferred embodiment, the test executive program of this invention is stored as instructions in memory 101. Those skilled in the art will recognize that the instructions may either be stored as computer software and/or firmware that is readable and executable by microprocessor 102. The results for a test performed by the test executive program are displayed on output device 106. Output device 106 is a display and associated drivers that allow an application to display images to a user. Those skilled in the art will recognize that the display may be a conventional cathode ray monitor or Liquid Crystal Display (LCD). The actual display used does not matter for purposes of this invention.

Microprocessor 102 executes the test executive program of this invention. Microprocessor 102 communicates with a Device Under Test (DUT) 108 via path 116. Processor 102 controls test equipment 117 via electrical line 118. Signals received via paths 116 and 118 by microprocessor 102 may be saved in memory 101.

One skilled in the art will recognize that this invention may be implemented by any electronic device having the same general configuration outline as in FIG. 1. These electronic devices include, but are not limited to, a computer system, logic circuits embedded in hardware, and an electronic analyzer.

Sometimes the test system must work with other electronic devices. For example, the test executive program of this invention is often used with manufacturing process controllers, and environmental test profile controllers. Since the electronic test executive program is often only one of many functions that such an electronic instrument controls, the electronic test executive program according to the invention has an interface that allows another electronic system to control the test executive program.

FIG. 8 illustrates a block diagram of a test executive program 800 that provides an interface to other electronic systems in accordance with this invention. In test executive program 800, test software 810 includes executable tests 812 and test systems control software 815. Test software 810 is all of the instructions needed for test executive program 800 to operate. They include tests, test procedures, and test system drivers. In other words, test software 810 is the code components that a test developer provides to test a specific product. There will generally be a number of different test software systems in a complete test system, as indicated by the stack 811. Each test software system 811 represents a software system for testing a different product or set of products. Tests 812 are the instruction for performing the individual tests. The heart of the test executive system are interfaces 817 which are preferably COM interfaces to the test software 810 and the external controls. Interface 817 includes instructions for applications that allow test software 810 to receive commands from other systems. Plug-ins 831-833 are instructions for interfacing with other systems 141, 143, and 149, such as a database or an equipment calibration verification system. Each system 141, 143, 149 that test executive program 800 interfaces with has an associated plug-in 831-833. Interface 820 also has generalized interface instructions 820 for allowing another system to control test executive program 800. As discussed below, preferably, interface instructions 820 include an ActiveX COM 825 interface for allowing direct control. ActiveX COM interfaces are well-known in the art, and will not be discussed in detail herein. Any external program or system 145 that can communicate via an ActiveX COM interface can control the test executive system 800.

Figure 2:
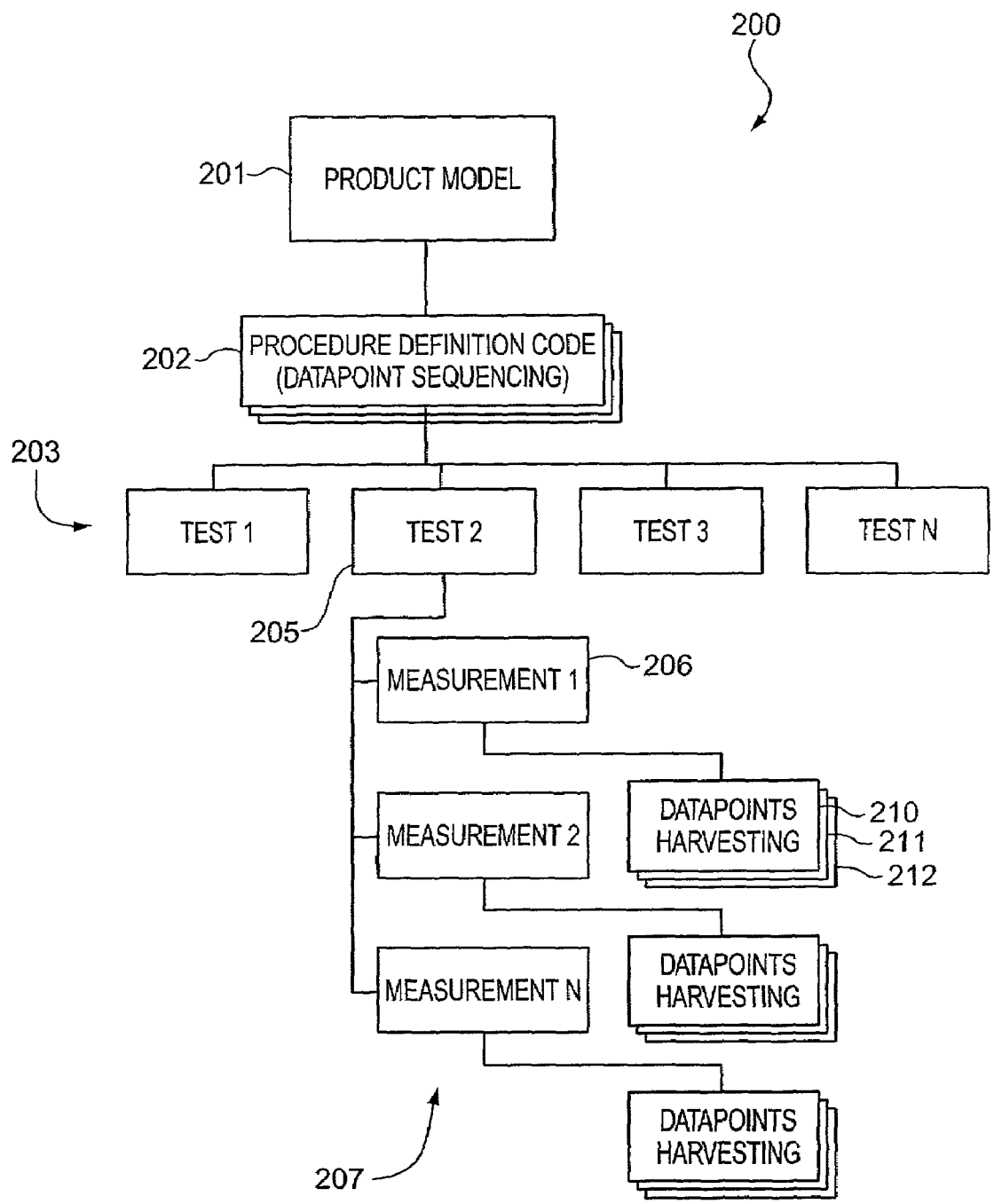
FIG. 2 illustrates a block diagram showing a hierarchical structure of a test executive program in accordance with this invention.

To better understand this invention, a hierarchical structure of a test executive program is described in FIG. 2. Block diagram 200 illustrates a hierarchical, multi-level structure of a test executive program.

First level 201 corresponds to a product model which is a file that a test developer creates to test a family of specific device model numbers. This file contains test procedures and inputs. Second level 202 is a group of procedures. A procedure is an ordered list, sequence, or script of tests to be run on a device. Several procedures may exist, which is represented in FIG. 2 by the stack of procedures 202. The next level is a test level 203 that includes tests 1-N to be run in each procedure 202. Each test 205 in turn includes a plurality of measurements 207 to be taken during a test 203. For example, test 205 includes measurements 206. Each measurement 1-N includes one or more datapoints 214. For example, measurement 206 includes data points 210-212.

Each procedure 202 is defined by a written program or a code used to build a structure of software objects. In one embodiment, the software objects are component object models, or COM, objects. COM is a language independent component architecture, not a programming language. COM is meant to be a general purpose, object-oriented structure to encapsulate commonly used functions and services.

COM and other object-oriented programming structures are well-known in the art. The exemplary software according to the invention was written in the Visual Basic™ programming language, but other programming languages may also be used. To connect with this body of art, we shall define various terms used herein within the context of that art. The term "test software" herein means the code components provided by a test developer to test a specific product. The term "manufacturing system" means the electronic test system manufacturing processes. The term "graphical user interface" means an input device that allows the user to manipulate and execute the invention by pointing and clicking on icons displayed on the invention. The term "input device" means a keyboard, knobs, spin controls, mouses, joy sticks, touch pads, roller balls, or other conventional input devices. The term "string" means a data structure composed of characters, usually in human-readable text.

The term "component object model (COM)" means component architecture independent and platform independent computer language that is meant to be a general purpose, object-oriented means to encapsulate commonly used functions and services. The COM defines the name, return type and parameters of the interface's methods. The term "objects" is a specific instance of a set of functions or methods collected into interfaces and each object has data associated with it. "Methods" are the action that a message carries out, the code which gets executed when the message is sent to a particular object. All communications to objects are done via "messages". "Messages" define the interface to the object. "Classes" define what it is to be an object. Creating an object from a class means to have created an instance of the class. The instances of the class are the actual objects. "Classes" are the blueprint of an object. "Objects" are unique individual instances of a particular class. The term "interfaces" means a defined collection of properties and methods that can be implemented by a class. The interface is essentially a table of pointers to the functions that make up the interface. "Pointers" are an indirect reference to data or code, analogous to an address. Each interface under COM is numerically unique. A class can be derived from one or more other classes; this is known as "inheritance".

COM supports interface inheritance, meaning the interface may be derived from another interface, inheriting the base interface's binary signature. The combination of the name and parameter of a method is usually called its signature. "Delegation" means the derived object creating or instantiating an instance of the base object. The derived object contains code for new behaviors and methods that are over-ridden, and serves as a pass-through for those method calls that are unchanged. The term "plug-in" means a program of data that improves or furthers the operation of the invention. The invention plug-ins are code components that allow the invention to be interfaced to other systems, such as a database or equipment calibration verification system. The term "computer platform" means a software operating system and/or open hardware such as Windows™ NT™ application. The term "dynamic link library (DLL)" means an executable code module for computer platforms that can be loaded on demand and linked at run time and then unloaded when the code is no longer needed. Test software and plug-in codes are contained in DLL files, so they can be developed and delivered independently.

Returning to FIG. 2, a test 203 is a group of measurements 207 in a procedure 202 that share a common testing algorithm or the same test software code. Some examples of tests 203 include, but are not limited to, an amplitude accuracy test, a test of harmonic distortion. Test executive program 200 repeatedly calls a test for each measurement and datapoint.

A measurement such as 206 is a configuration or a set up of a test. Each measurement 206 within a test 203 can have different setup or configuration parameters. Tests 203 are parameter driven. Parameters are inputs at a measurement level. Measurements 207 are elements such as range in volts, frequency in kilohertz, or a harmonic (an integer number).

Each procedure 202 uses measurements 207 as data to be passed from procedure 202 to a test 203. A measurement 207 is also a phase of execution. During a measurement phase of execution of a test 203, a measurement 207 is started but data is not collected. Therefore, multiple DUTs 108 may be configured and tested concurrently.

Datapoints 210-212 are a subset of a measurement. These datapoints 210-212 include additional parameters that select a result when one measurement generates multiple results. For example, a measurement may have minimum and maximum datapoints for a spectrum analyzer sweep or different datapoints for each channel of a device. For each datapoint 210-212, a value result is determined. The value result is then compared to specification results. Specification results may include numerical limits, string match, and/or Boolean pass/fail results. There may be three different types of numerical limits including marginal limits, line limits, and customer limits. Each limit has an upper value and a lower value.

Figure 3:
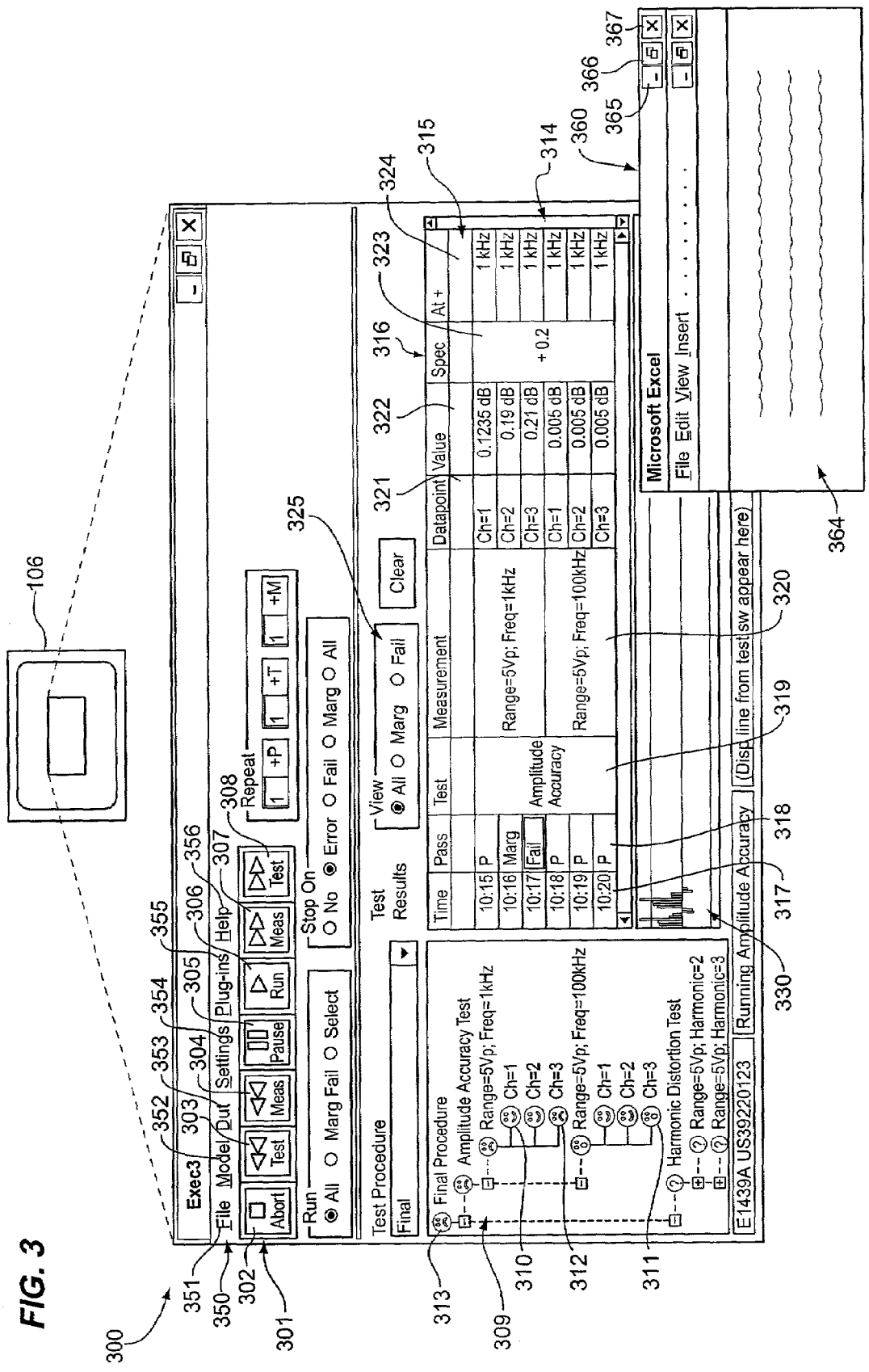
FIG. 3 illustrates a view of a graphical user interface (GUI) of an electronic executive test program.

User interaction of computer system 100 (FIG. 1) executing a test executive program are handled through a Graphical User Interface (GUI). FIG. 3 illustrates a GUI 300 as displayed by output device 106 in accordance with a test executive program of this invention. GUI 300 includes buttons 301 that are used to control a test. For convenience of the user, buttons 301 have indicia that indicate the function served by a button. For example, buttons 301 appear as tape recorder buttons in accordance with a preferred embodiment of this invention. In the preferred embodiment, these buttons include abort button 302, restart test button 303, restart measurement button 304, pause button 305, run button 306, skip measurement button 307, and skip test button 308. One skilled in the art will recognize that, while tape recorder symbols are used in this embodiment, any number of different indicia may be used to identify buttons 301.

Area 314 on the right side of GUI 300 in the preferred embodiment is a display of test results. In the preferred embodiment, area 314 includes a series of rows 315 and columns 316 displaying results of individual tests. Column 317 indicates the time that a test is executed. Column 318 displays a status of the test. Column 319 also displays a name of a test. For example, one test is an amplitude frequency. Column 320 indicates a type of measurement being taken during a test. For example, range=5 Vp; frequency=1 kHz. Column 321 displays the channel or datapoint under test, for example, ch=1 or ch=2. Column 322 displays a value or result of the test for a channel or datapoint. Column 323 displays a specification, such as +0.2. Column 324 displays a parameter such as 1 kHz.

Buttons 325 facilitate the sorting of displayed tests to allow a user to view desired tests. In the preferred embodiment, buttons 325 include an all button, a marginal pass button, and a fail button. However, one skilled in the art will recognize that any number of additional ways to view the data may be added. Area 330 displays a progress bar that represents the progress of a procedure being executed.

In the preferred embodiment, area 309 illustrates a test tree 313 that represents the tests being performed in a procedure area 309 and includes a hierarchy of tests, measurements, and datapoints. Test tree 313 includes icons that indicate a status of a test. The icons indicate pass, fail, marginal, and not-yet tested. In a preferred embodiment, a "smiley face" indicates a pass, a "surprised face" indicates a marginal pass, and a "frowning face" indicates a fail. The icon for the procedure indicates the status of the entire procedure, while icons for each test represent the status of an individual test. The icon for the procedure is determined by a Boolean AND operation in which fail has priority. Thus, if one test fails, the procedure fails.

Figure 4:
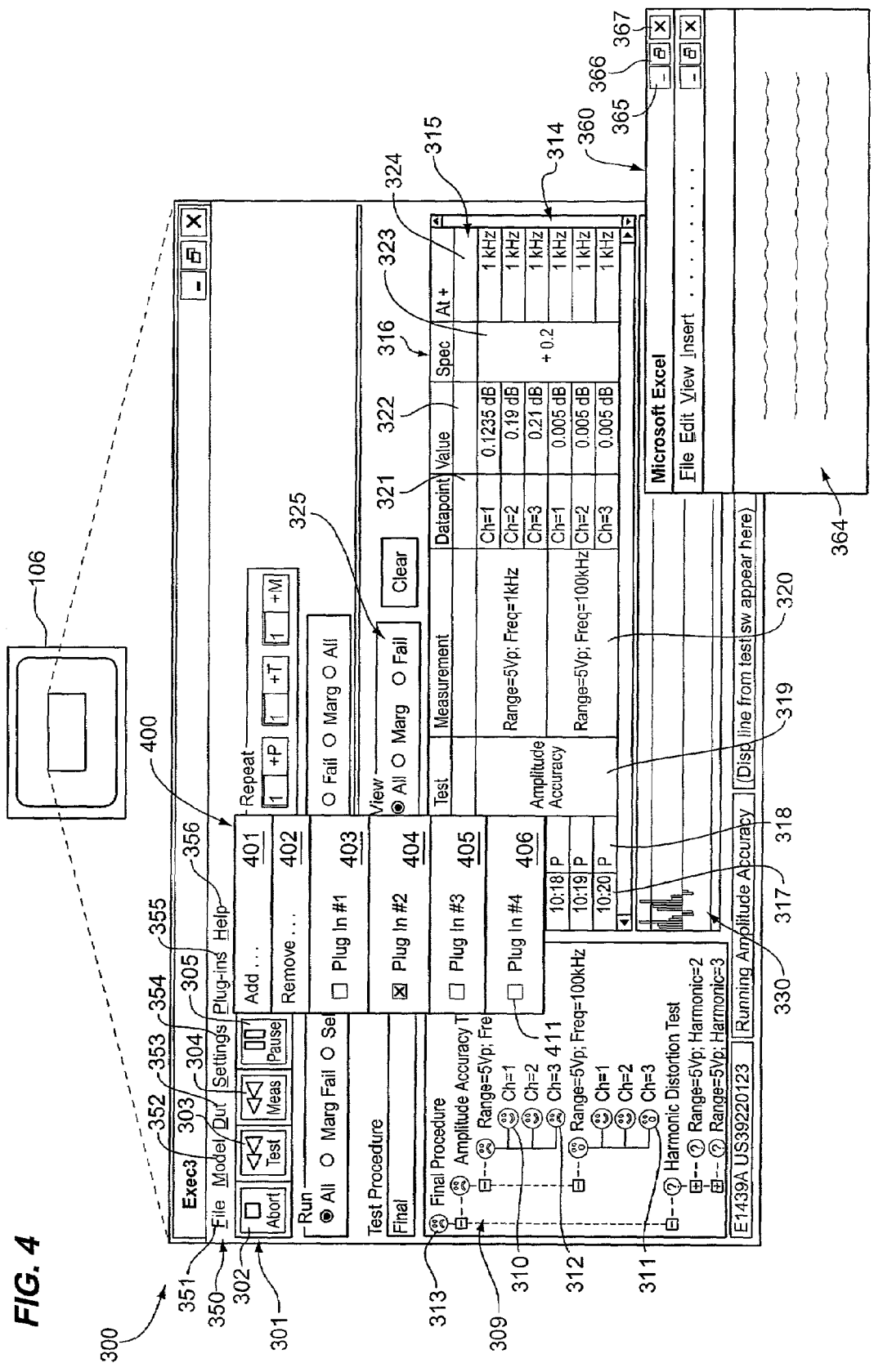
FIG. 4 illustrates a view of a GUI having menus for plug-in selection in accordance with a preferred embodiment of this invention.

GUI 300 also includes a menu bar 350. Menu 350 displays a list of menu options for controlling the test executive program. Menu 350 includes file menu 351, model menu 352, DUT menu 353, setting menu 354, plug-in menu 355 and help menu 356. File menu 351 includes a list of options for opening and closing files for use with the test executive program. Model menu 352 displays a list of model families that may be tests. DUT menu 353 displays a screen for entry of a DUT model, serial number, options and other information for identifying a DUT. Settings menu 354 displays a menu for viewing and changing executive settings. When highlighted, plug-in menu 355 displays dropdown menu 400 (FIG. 4). Help menu 356 displays a list of help functions available in the test executive program.

GUI 300 also includes a user interface 360 for a system, such as 141, that is connected to the test executive system via a plug-in interface 140. In the embodiment shown, system 141 is a Microsoft Excel database. As is known in the art, interface 360 is preferably a window that can be maximized by clicking on button 366, minimized by clicking on button 365, or closed by clicking on button 367. As is known in the art, it can be located where desired on display 106 by clicking and dragging. The data displayed in area 315 is also displayed in area 364 in Microsoft Excel format. Similarly, the test executive system can be viewed and/or controlled via a host of other systems which may comprise software, hardware, firmware, or combinations thereof.

FIG. 4 illustrates a screen displayed to a user in response to plug-in menu 355 being selected by a user. One skilled in the art will recognize that the selection of plug-in menu 355 may be made by "clicking" on plug-in menu 355, typing a "p" in with a keyboard, or any other method that may be used. When plug-in menu 355 is selected, menu 400 is displayed. In a preferred embodiment, menu 400 is a drop down menu that is displayed directly under the plug-in menu 355 icon. Menu 400 includes a list 403-406 of plug-ins available for use. One skilled in the art will recognize that, although shown as plug-in #1 through plug-in #3, each plug-in in list 403-406 may have a name that indicates the type of plug-in or system the plug-in serves. Clicking on a box 411 associated with a plug-in displays the user interface 360 for that plug-in. In the embodiment shown, plug-in #2 is enabled. The user interface may be closed by clicking on box 411 a second time, or by clicking on close button 367 on the interface.

Menu 400 may also include add option 401. A user selects add option 401 to add a plug-in to the plug-ins in list 403-406. A menu displaying available plug-ins is then displayed. The user then selects a plug-in to add. Menu 400 may also include remove option 402. When remove option 402 is selected, the plug-ins available for use are displayed in a menu and the user selects one of the plug-ins to remove from the plug-ins available.

FIG. 5 illustrates a process 500 for display menu 400 of plug-ins available and receiving a selection of a plug-in to execute. Process 500 begins in act 510 when the processor receives a request for the plug-ins available to be displayed. In act 520, process 500 determines the plug-ins available for use. Act 520 may be executed by reading a file storing file names of executable files for plug-ins. In act 530, the plug-ins determined to be available for use are displayed. In a preferred embodiment, the display is list 403-406 displayed in menu 400. In act 540, the processing unit receives a selection of a plug-in to execute from the user. In act 550, process 500 ends by executing the plug-in selected in act 540.

FIG. 6 illustrates a process 600 for adding a plug-in to the list 403-406 of plug-ins available for use. Process 600 begins in act 610 when the processing unit receives a request to add a new plug-in. In the preferred exemplary embodiment, the request is received by receiving a mouse "click" on the add option 401 in menu 400. In response to receiving a request to add a plug-in, the processing unit displays a request for the folder or directory in which the plug-in to add is stored in act 620. In a preferred exemplary embodiment, this display is a dialog box that has a hierarchical view of the folders or directories stored in a specified memory in a first area and a second area showing files in a highlighted directory or folder. In 630, the processing unit receives a directory or folder to search. The processing unit searches the input directory or folder for an executable file of a plug-in at 640. The plug-ins available for selection are then displayed at 650. The executable files of plug-ins found are shown in the second area of the dialog box in the preferred exemplary embodiment.

At 660, the processing unit receives a selection of one of the displayed plug-ins to add to list 403-406. In a preferred exemplary embodiment, the plug-in may be received as a double mouse "click" on the name of the plug-in executable file, or any other method those skilled in the art desire. At 670, process 600 ends with the processing unit storing the file name and location of the selected plug-in in a file storing the names of available plug-ins.

Figure 7:
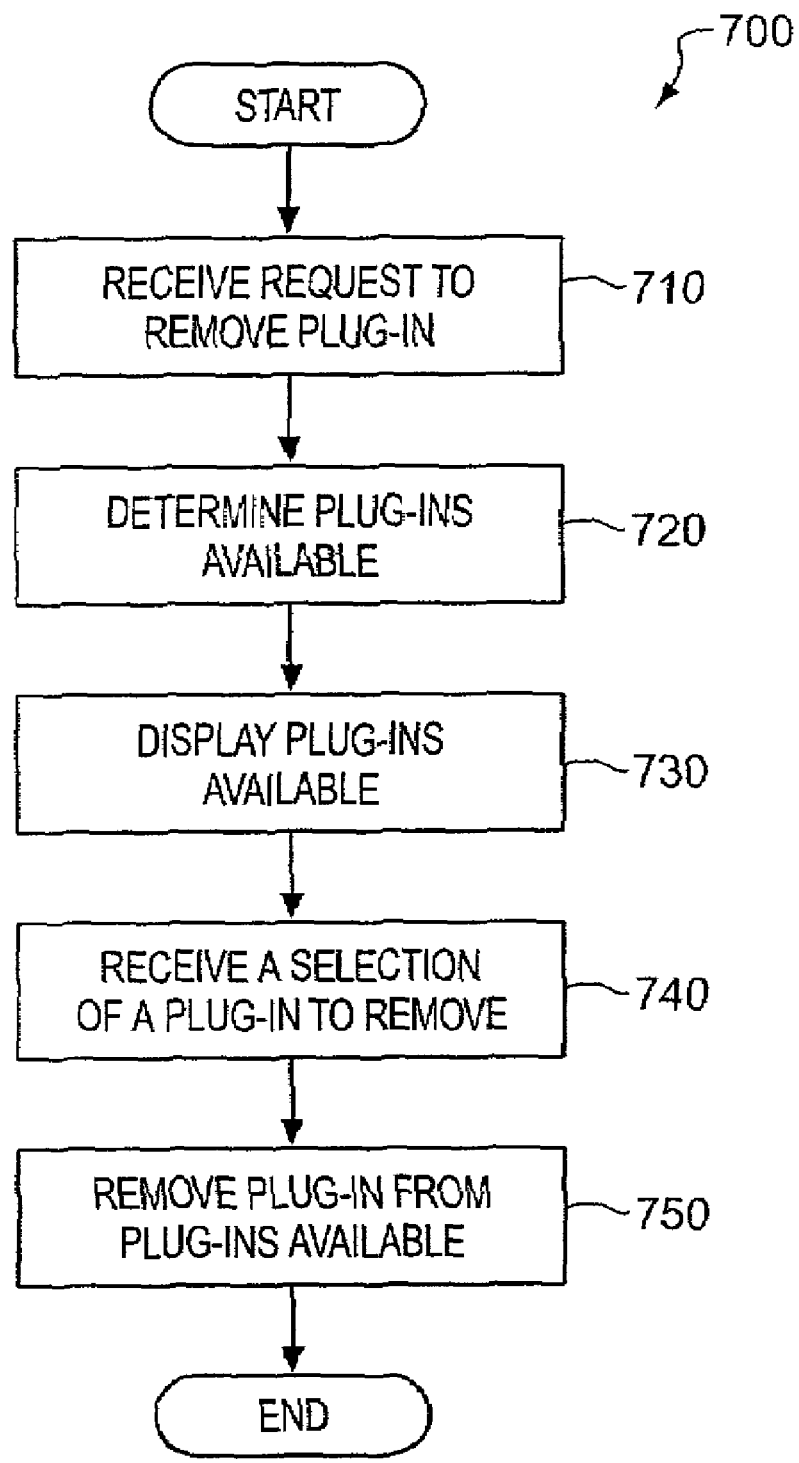
FIG. 7 illustrates a flow diagram of an application for removing a plug-in from the available plug-ins in accordance with a preferred embodiment of this invention.

FIG. 7 illustrates process 700 which a processing unit executes in response to receiving a request to remove a plug-in from the list of available plug-ins. Process 700 begins at 710 with the processing unit receiving a request to remove a plug-in from the list of available plug-ins. In the preferred exemplary embodiment, the request to remove an item is received by a double mouse "click" on remove option 402 displayed in menu 400. At 720, the processing unit determines the list 403-406 of plug-ins available for use. This may be done by reading a file storing a list of location and file names of executable files of plug-ins available for use.

At 730, the processing unit displays the plug-ins available for use. This may be done in a dialog box showing the names of all plug-ins available for use. The user then inputs a selection of a plug-in to remove which the processing unit receives at 740. At 750, process 700 ends with the processing unit removing the selected plug-in from list 403-406. This may be completed by removing the name of the executable file of the plug-in from the file containing the list of plug-ins available.

Returning to FIG. 8, each plug-in 831-833 preferably comprises a DLL file. Each time a user selects a plug-in, the corresponding DLL is loaded. Multiple DLLs can run at the same time, and thus multiple systems can be connected to the system at the same time. The data objects that are shared by test software 810 and 811, plug-ins 831-833, and test interfaces 817 are defined in a DLL file that contains mostly class definitions for data objects and test interfaces. That is, these objects contain the pure virtual base classes that define interfaces 817. Actual test software and plug-in classes are derived from these base classes, preferably by using Visual Basic's IMPLEMENTS keyword.

The system according to the invention makes the test executive system according to the invention extremely flexible. It permits the user to utilize a user interface that he or she is familiar with to operate the test system. It permits a wide variety of hardware or software systems to be used to control the test systems, and thus minimizes the reconfiguration of manufacturing and or test systems to be able to use the system. All this is done in a transparent way with a basic GUI that is intuitive and user friendly. The invention takes the test executive system out of the category of specialized niche products and into the mainstream of computer software that enables it to be used by nearly anyone experienced in the use of computers.

The above is a description of a preferred exemplary embodiment of an externally controllable test executive program. It is understood that, now that it has been described in detail how an exemplary externally controllable test executive system is designed, those skilled in the art can design alternative test executive programs that provide external controllability and plug-ins as set forth in the below claims either literally or through the Doctrine of Equivalents.

What is claimed is:

1. An electronic test system for testing a device under test (DUT) that is separate and distinct from said electronic test system, said test system comprising:
 a memory for storing i) an electronic test, and ii) a plurality of interfaces for communicating with an external system distinct from said test system and separate and distinct from said DUT and for permitting said test system to be operated by said external system;
 a display for displaying a graphical user interface (GUI) for operating said electronic test system and the results of said test, said GUI including a drop-down menu for selecting one of said plurality of interfaces;
 an electronic processor communicating with said memory for executing said test and with said display for displaying said results; and
 an input device for operating said GUI.

2. An electronic test system as in claim 1 wherein said selected interface comprises a software object.

3. An electronic test system as in claim 1 wherein said selected interface comprises a Dynamic Link Library (DLL) file.

4. An electronic test system as in claim 1 wherein said selected interface comprises an ActiveX Component Object Model (COM) interface.

5. An electronic test system as in claim 4 wherein said external system is a computer remote from said memory and processor.

6. An electronic test system as in claim 1 wherein said external system is a software system.

7. An electronic test system as in claim 6 wherein said software system comprises a program stored in said memory.

8. An electronic test system as in claim 6 wherein said external system comprises a software database system.

9. An electronic test system as in claim 1 wherein said GUI comprises a GUI associated with said external system.

10. A product that provides a test executive program for controlling tests on a device under test (DUT) separate and distinct from said test executive program, said product comprising:
 instructions for directing a processing unit to:
  perform an electronic test on said DUT;
  display a list of different software interfaces for communicating with an external system that is distinct from said test executive program and for permitting said test executive program to be operated by said external system;
  receive a selection of one of said different software interfaces on said list;
  load the selected software interface into memory;
  communicate with said external system using said selected software interface; and
  in response to signals generated by said external system, operate said test executive program; and
 a media readable by said processing unit that stores said instructions.

11. The product of claim 10 wherein said instructions further comprise instructions for directing said processing unit to execute said selected software interface.

12. The product of claim 10 wherein said instructions further comprise instructions for directing said processing unit to remove said selected software interface from said memory.

13. The product of claim 10 wherein said instructions comprise an ActiveX Component Object Model (COM) interface.

14. A method of operating an electronic test system for testing a device under test (DUT) that is separate and distinct from said electronic test system, said method comprising:
- using a memory, storing i) an electronic test, and ii) a plurality of different software interfaces for communicating with an external system distinct from said test system and separate and distinct from said DUT and for operating said test system with said external system;
- using a display, displaying a graphical user interface (GUI) for operating said electronic test system, said GUI displaying a list of the plurality of different software interfaces; and
- using an electronic processor communicating with said memory:
  - executing said test to produce test results;
  - storing said test results;
  - executing a software interface selected from said list of the plurality of different software interfaces, by loading said selected software interface into a memory;
  - receiving a communication from said external system; and
  - responsive to said communication, operating said test system.

15. A method as in claim 14 wherein said external system comprises an external software program and said receiving comprises executing said external software program.

16. A method as in claim 15 wherein said displaying comprises displaying a GUI associated with said external software program.

17. A method as in claim 14 wherein said executing comprises executing a software object.

18. A method as in claim 14 wherein said operating comprises providing said test results to said external system as said test is executed.

* * * * *